United States Patent [19]

Okumura et al.

[11] Patent Number: 5,616,063

[45] Date of Patent: Apr. 1, 1997

[54] POLISHING APPARATUS

[75] Inventors: Katsuya Okumura, Poughkeepsie, N.Y.; Riichirou Aoki, Tokyo; Hiromi Yajima, Kanagawa--ken; Masako Kodera, Kanagawa-ken; Shirou Mishima, Kanagawa-ken; Atsushi Shigeta, Kanagawa-ken; Masayoshi Hirose, Tokyo; Norio Kimura, Tokyo; Seiji Ishikawa, Tokyo, all of Japan

[73] Assignees: Kabushiki Kaisya Toshiba, Kanagawa-ken; Ebara Corporation, Tokyo, both of Japan

[21] Appl. No.: 309,193

[22] Filed: Sep. 20, 1994

[30] Foreign Application Priority Data

Sep. 21, 1993 [JP] Japan ................. 5-259396

[51] Int. Cl.⁶ ..................... B24B 49/00; B24B 51/00
[52] U.S. Cl. ..................... 451/1; 451/5; 451/285
[58] Field of Search ..................... 451/1, 5, 8, 11, 451/41, 283, 285, 287, 288, 289, 290, 292

[56] References Cited

U.S. PATENT DOCUMENTS

| | | | |
|---|---|---|---|
| 4,141,180 | 2/1979 | Gill, Jr. et al. | 451/289 |
| 4,193,226 | 3/1980 | Gill, Jr. et al. | 451/289 |
| 4,313,266 | 2/1982 | Tam . | |
| 4,653,231 | 3/1987 | Cronkhite et al. . | |
| 4,680,893 | 7/1987 | Cronkhite et al. | 451/41 |
| 4,851,101 | 7/1989 | Hutchinson . | |
| 4,905,425 | 3/1990 | Sekigawa et al. | 451/41 |
| 4,956,944 | 9/1990 | Ando et al. | 451/5 |
| 4,984,392 | 1/1991 | Sekigawa et al. | 451/11 |
| 5,329,732 | 7/1994 | Karlsrud et al. | 451/290 |
| 5,333,413 | 8/1994 | Hashimoto | 451/290 |
| 5,361,545 | 11/1994 | Nakamura | 451/290 |
| 5,421,768 | 6/1995 | Fujiwara et al. | 451/285 |

*Primary Examiner*—James G. Smith
*Assistant Examiner*—Derris H. Banks
*Attorney, Agent, or Firm*—Wenderoth, Lind & Ponack

[57] ABSTRACT

A polishing apparatus is a cluster type of apparatus having a plurality of units which perform various operations. The polishing apparatus includes a universal transfer robot having at least one arm for transferring a workpiece, a plurality of units disposed around the universal transfer robot and including a loading unit for receiving the workpiece to be polished, at least one polishing unit for polishing the workpiece, at least one washing unit for washing the workpiece which has been polished and an unloading unit for receiving the cleaned workpiece. Discrete mechanisms respectively transfer a clean workpiece and a dirty workpiece amongst the units.

16 Claims, 10 Drawing Sheets

F I G. 1
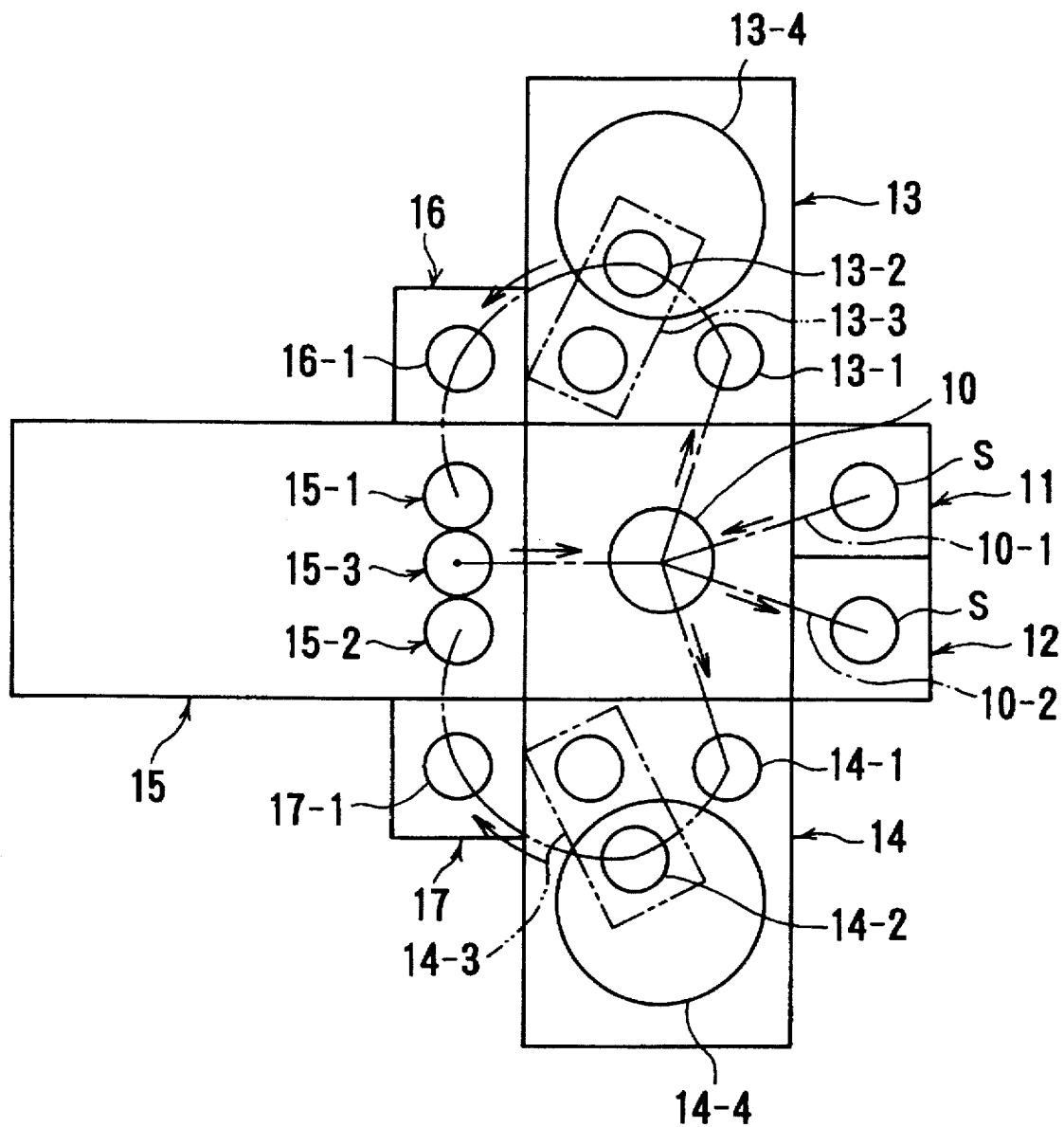

F I G. 3
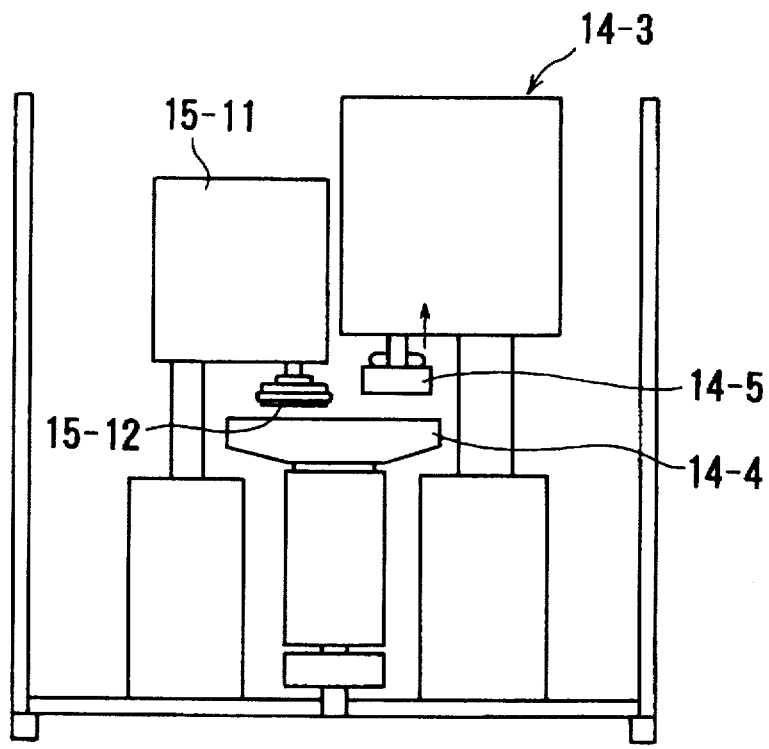
F I G. 4
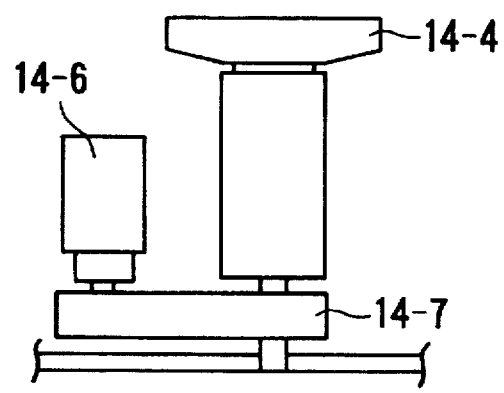

F I G. 8
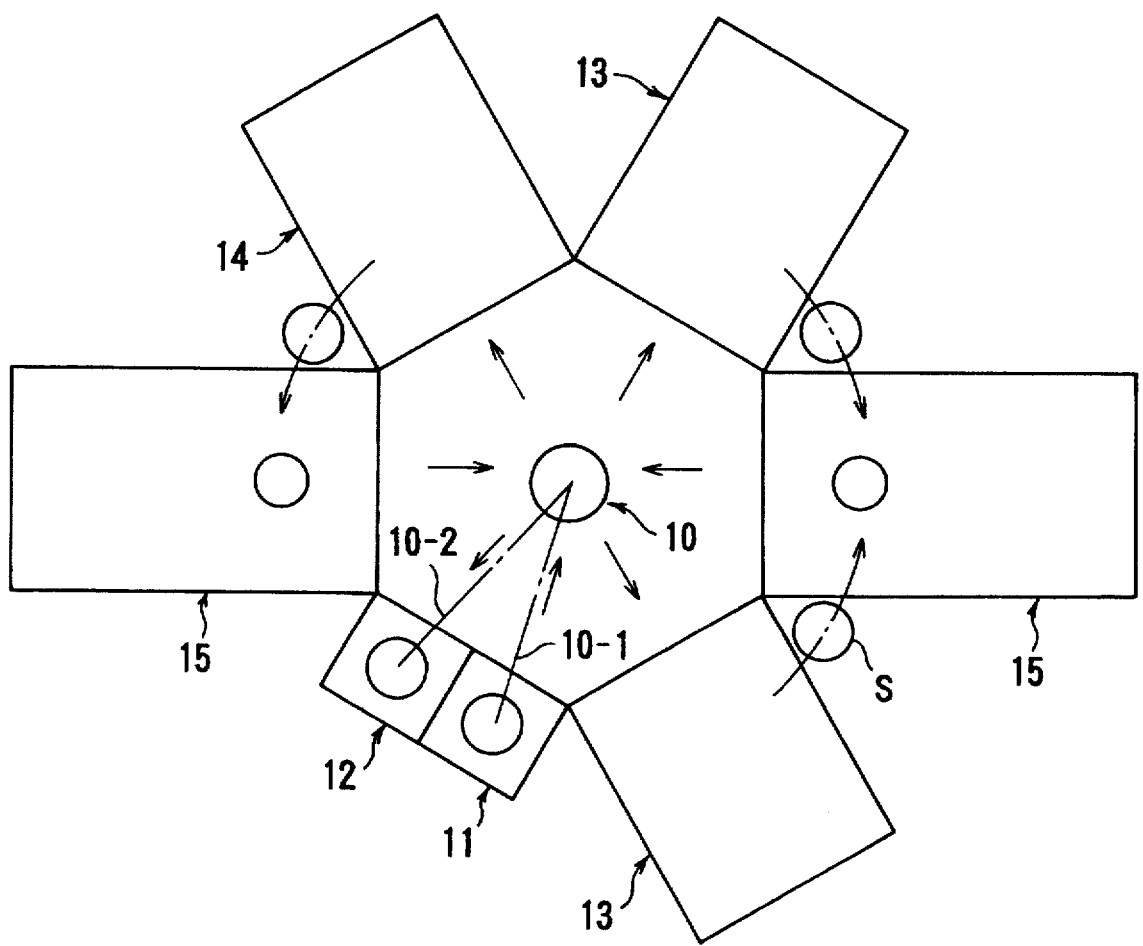

POLISHING APPARATUS

BACKGROUND OF THE INVENTION

1. Field of the Invention

The present invention relates to a polishing apparatus, and more particularly to a polishing apparatus which has a polishing unit for polishing a workpiece such as a semiconductor wafer, a washing unit for washing the workpiece which has been polished and a universal transfer robot for transferring the workpiece.

2. Description of the Related Art

Recent rapid progress in semiconductor device integration demands smaller and smaller wiring patterns or interconnections and also narrower spaces between interconnections which connect active areas. One of the processes available for forming such interconnection is photolithography. Although the photolithographic process can form interconnections that are at most 0.5 μm wide, it requires that surfaces on which pattern images are to be focused by a stepper be as flat as possible because the depth of focus of the optical system is relatively small.

It is therefore necessary to make the surfaces of semiconductor wafers flat for photolithography. One customary way of flattening the surfaces of semiconductor wafers is to polish them with a polishing apparatus.

Conventionally, such a polishing apparatus has a single function of polishing a semiconductor wafer. Therefore, in the case of washing a semiconductor wafer after polishing, the semiconductor wafer is required to be transferred or transported from the polishing apparatus to a washing apparatus. Further, in the case of polishing a semiconductor wafer again under a different condition after a first polishing operation, the semiconductor wafer is required to be transferred or transported from one polishing apparatus to another polishing apparatus. In these cases, the semiconductor wafers are manually transferred or transported by a movable container in which they are immersed in water to keep them from drying during transportation. However, since various apparatuses including a polishing apparatus and a washing apparatus are independently installed and the semiconductor wafers are transferred or transported by the movable container containing water therein, it is difficult to install the polishing apparatus, the washing apparatus and the like in a clean room of a semiconductor manufacturing plant and to automate various processes including a polishing process and a washing process completely.

In order to solve the above problems, there has been proposed an apparatus which has a polishing unit and a washing unit housed in a common housing. Further, if necessary, there is a possibility that a plurality of polishing units are housed in a common housing.

In the polishing apparatus which has a polishing unit and a washing unit, or a plurality of polishing units in a common housing, it is conceivable to construct a cluster type of polishing apparatus which integrates a plurality of units including a polishing unit and a washing unit, as adopted in a semiconductor manufacturing process such as etching or chemical vapor deposition (CVD).

However, in the case of constructing a cluster type of polishing apparatus which integrates a plurality of units and incorporates a universal transfer robot at a central position of the units, it is necessary to handle a dirty and wet semiconductor wafer soiled with abrasive slurry or particles generated by the polishing operation or a clean and dry semiconductor wafer which is placed on a loading unit or an unloading unit. Therefore, a conventional robot incorporated in a cluster type of a semiconductor manufacturing processing apparatus cannot be used in a cluster type of polishing apparatus because the robot cannot handle a clean semiconductor wafer and a dirty semiconductor wafer separately. If the conventional robot is incorporated in the polishing apparatus, a washing process and a drying process of the robot or a robot arm are additionally required, thus lowering throughput.

Further, in the case of leaving the robot or the robot arm for a long time as it is, abrasive material or particles generated by the polishing operation adheres to the robot or the robot arm, resulting in contaminating of subsequent semiconductor wafers or respective units of the polishing apparatus.

SUMMARY OF THE INVENTION

It is therefore an object of the present invention to provide a cluster type of polishing apparatus having a plurality of units which perform various operating, and has exclusive means for handling a clean semiconductor wafer and exclusive means for handling a dirty semiconductor wafer.

According to the first aspect of the present invention, there is provided a polishing apparatus for polishing a surface of a workpiece and washing the workpiece which has been polished, comprising: a universal transfer robot having at least one arm for transferring the workpiece; a plurality of units disposed around the universal transfer robot and including a loading unit for receiving the workpiece to be polished, at least one polishing unit for polishing the workpiece which is transferred from the loading unit, at least one washing unit for washing the workpiece which has been polished and an unloading unit for receiving the cleaned workpiece; and an exclusive transferring device for transferring the workpiece between two units of the plurality of units adjacent to each other; wherein the universal transfer robot transfers a clean workpiece and the exclusive transferring device transfers a dirty workpiece.

According to the first aspect of the present invention, the loading unit, the unloading unit, the polishing unit and the washing unit are disposed around the universal transfer robot. A clean workpiece is picked up from the loading unit by the universal transfer robot, transferred to the polishing unit, and polished by the polishing unit. After a polishing process, a dirty workpiece is transferred from the polishing unit to the washing unit by the exclusive transferring device, and washed by the washing unit. After a washing process, a clean workpiece is transferred from the washing unit to the unloading unit by the universal transfer robot.

According to the second aspect of the present invention, there is provided a polishing apparatus for polishing a surface of a workpiece and washing the workpiece which has been polished, comprising: a universal transfer robot having at least two arms for transferring the workpiece; and a plurality of units disposed around the universal transfer robot and including a loading unit for receiving the workpiece to be polished, at least one polishing unit for polishing the workpiece which is transferred from the loading unit, at least one washing unit for washing the workpiece which has been polished and an unloading unit for receiving the cleaned workpiece; wherein the universal transfer robot has an arm for exclusively handling a clean workpiece and an arm for exclusively handling a dirty workpiece.

According to the second aspect of the present invention, the loading unit, the unloading unit, the polishing unit and the washing unit are disposed around the universal transfer robot. A clean workpiece is picked up from the loading unit by the arm for exclusively handling a clean workpiece of the universal transfer robot, transferred to the polishing unit, and polished by the polishing unit. After a polishing process, a dirty workpiece is transferred from the polishing unit to the washing unit by the arm for exclusively handling a dirty workpiece of the universal transfer robot, and washed by the washing unit. After a washing process, a clean workpiece is transferred from the washing unit to the unloading unit by the arm for exclusively handling a clean workpiece of the universal transfer robot.

According to the third aspect of the present invention, there is provided a polishing apparatus for polishing a surface of a workpiece and washing the workpiece which has been polished, comprising: two universal transfer robots each having at least one arm for transferring the workpiece; and a plurality of units disposed around the universal transfer robots and including a loading unit for receiving the workpiece to be polished, at least one polishing unit for polishing the workpiece which is transferred from the loading unit, at least one washing unit for washing the workpiece which has been polished and an unloading unit for receiving the cleaned workpiece; wherein one of the universal transfer robots transfers a clean workpiece and the other of the universal transfer robots transfers a dirty workpiece.

According to the third aspect of the present invention, the loading unit, the unloading unit, the polishing unit and the washing unit are disposed around the two universal transfer robots. A clean workpiece is picked up from the loading unit by the universal transfer robot for exclusively handling a clean workpiece, transferred to the polishing unit, and polished by the polishing unit. After a polishing process, a dirty workpiece is transferred from the polishing unit to the washing unit by the universal transfer robot for exclusively handling a dirty workpiece, and washed by the washing unit. After a washing process, a clean workpiece is transferred from the washing unit to the unloading unit by the universal transfer robot for exclusively handling a clean workpiece.

BRIEF DESCRIPTION OF THE DRAWINGS

FIG. 1 is a schematic plan view of an embodiment of a polishing apparatus according to the present invention;

FIG. 3 is a cross-sectional view taken along line A1–A2 of FIG. 2A;

FIG. 4 is a cross-sectional view taken along line B1–B2 of FIG. 2A;

FIG. 8 is a schematic plan view of the third embodiment of a polishing apparatus according to the present invention;

DETAILED DESCRIPTION OF THE PREFERRED EMBODIMENTS

Figure 2B:
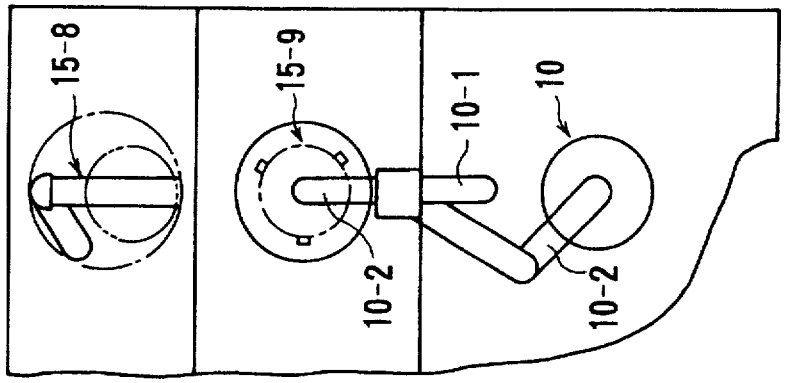
FIG. 2B is a schematic plan view of an embodiment of a washing unit in a polishing apparatus according to the present invention.

A first embodiment of a polishing apparatus according to the present invention will be described below with reference to FIG. 1. Each of the embodiments, however, will be described for use with a semiconductor wafer as a workpiece to be polished. As shown in FIG. 1, a polishing apparatus has a center robot 10 having arms 10-1 and 10-2 at a central part thereof. The center robot 10 constitutes a universal transfer robot. Around the center robot 10 and in the area where the arm 10-1 can access, there are provided a loading unit 11 on which a semiconductor wafer S to be polished is placed, an unloading unit 12 on which the semiconductor wafer S which has been polished is placed, polishing units 13 and 14 each for polishing the semiconductor wafer S and a washing unit 15 for washing the semiconductor wafer S.

The polishing unit 13 has a polishing head supporting arm 13-3, a turntable 13-4 and a top ring rotatably provided on the polishing head supporting arm 13-3. The polishing unit 14 has a polishing head supporting arm 14-3, a turntable 14-4 and a top ring rotatably provided on the polishing head supporting arm 14-3. An abrasive cloth is attached to respective upper surfaces of the turntables 13-4 and 14-4. Each of the polishing head supporting arms 13-3 and 14-3 constitutes an exclusive transferring device for transferring the semiconductor wafer S from a loading position 13-1, 14-1 of the polishing unit to the turntable 13-4, 14-4. Further, each of the polishing head supporting arms 13-3 and 14-3 constitutes an exclusive transferring device for transferring the semiconductor wafer S from the polishing unit 13, 14 to the washing unit 15. The polishing apparatus has a table 16 for placing a dressing tool for dressing the abrasive cloth on the turntable 13-4 and a table 17 for placing a dressing tool for dressing the abrasive cloth on the turntable 14-4.

In the polishing apparatus, the semiconductor wafer S to be polished is picked up under vacuum by the arm 10-1 of the center robot 10, is inverted to dispose its surface to be polished downward, and is transferred to the loading position 13-1 of the polishing unit 13. The top ring of the polishing head supporting arm 13-3 holds the semiconductor wafer S and presses the semiconductor wafer S against the abrasive cloth attached to the upper surface of the turntable 13-4. At this time, the turntable 13-4 is rotated, and the top ring is rotated about its own axis and swung on the turntable 13-4 by the polishing head supporting arm 13-3, whereby the semiconductor wafer S is polished.

After a polishing process, the semiconductor wafer S is transferred to a loading position 15-1 of the washing unit 15 by the polishing head supporting arm 13-3. The polishing head supporting arm 13-3 which releases the semiconductor wafer S at the loading position 15-1 chucks a dressing tool 16-1 on the table 16 and presses the dressing tool 16-1 against the abrasive cloth on the turntable 13-4, thereby dressing the abrasive cloth. This dressing work may be performed by an exclusive dressing mechanism.

The semiconductor wafer S which has been transferred to the loading position 14-1 of the polishing unit 14 by the arm 10-1 of the center robot 10 is also held by the top ring of the polishing head supporting arm 14-3 and pressed against the abrasive cloth attached to the upper surface of the turntable 14-4. After a polishing process, the semiconductor wafer S is transferred to a loading position 15-2 of the washing unit 15. Further, the polishing head supporting arm 14-3 which releases the semiconductor wafer S chucks a dressing tool 17-1 on the table 17 and presses the dressing tool 17-1 against the abrasive cloth on the turntable 14-4, thereby dressing the abrasive cloth.

The semiconductor wafer S transferred to the loading position 15-1 or the loading position 15-2 is washed in the washing unit 15, and then transferred to an unloading position 15-3. The cleaned semiconductor wafer S is transferred from the unloading position 15-3 to the unloading unit 12 by the arm 10-2 of the center robot 10. All of the above-described operations are performed automatically.

Next, the polishing unit 14 and the washing unit 15 will be described in detail with reference to FIGS. 2 through 6 also. FIGS. 2 through 6 show the first embodiment of the present invention. However, a dressing tool and a table for placing the dressing tool are not provided. Rather, exclusive dressing mechanism 15-11 is provided.

Figure 2A:
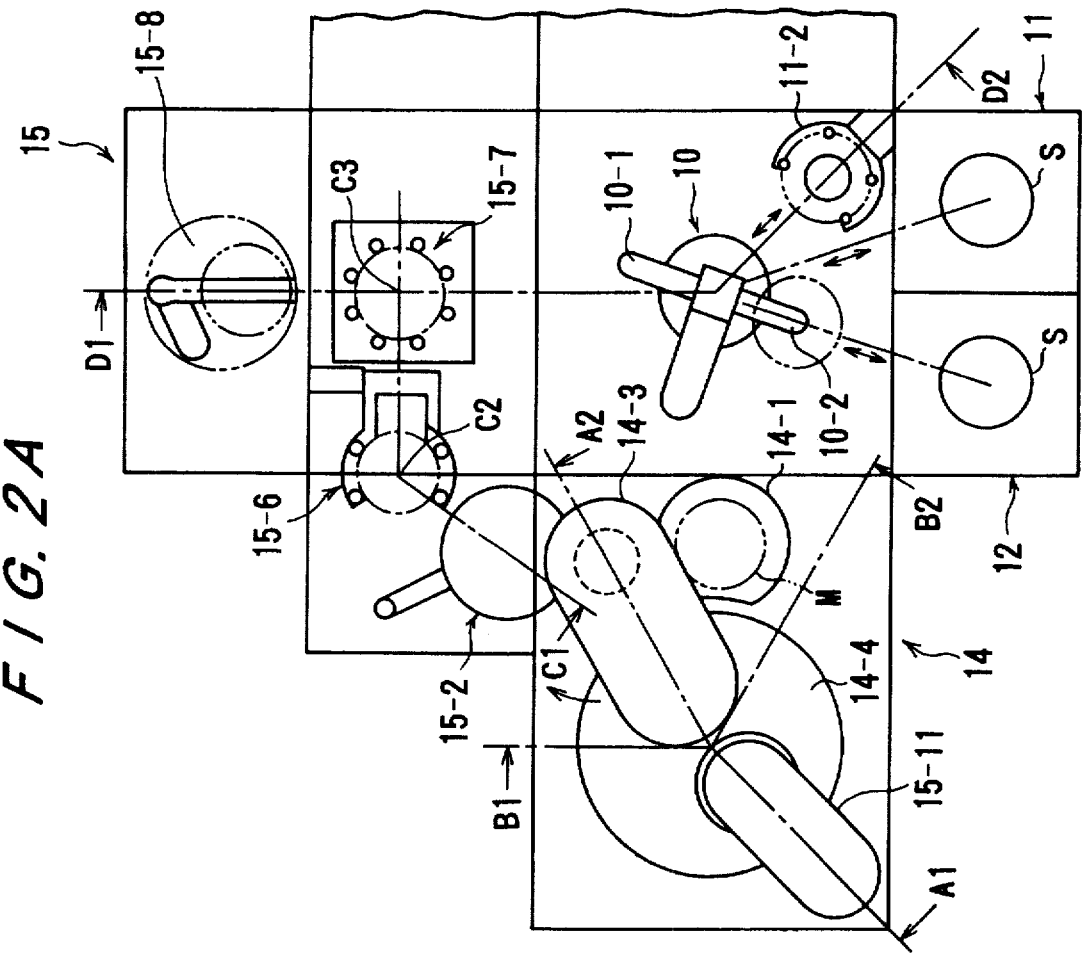
FIG. 2A is a schematic plan view of part of the polishing apparatus according to the present invention.
Figure 5:
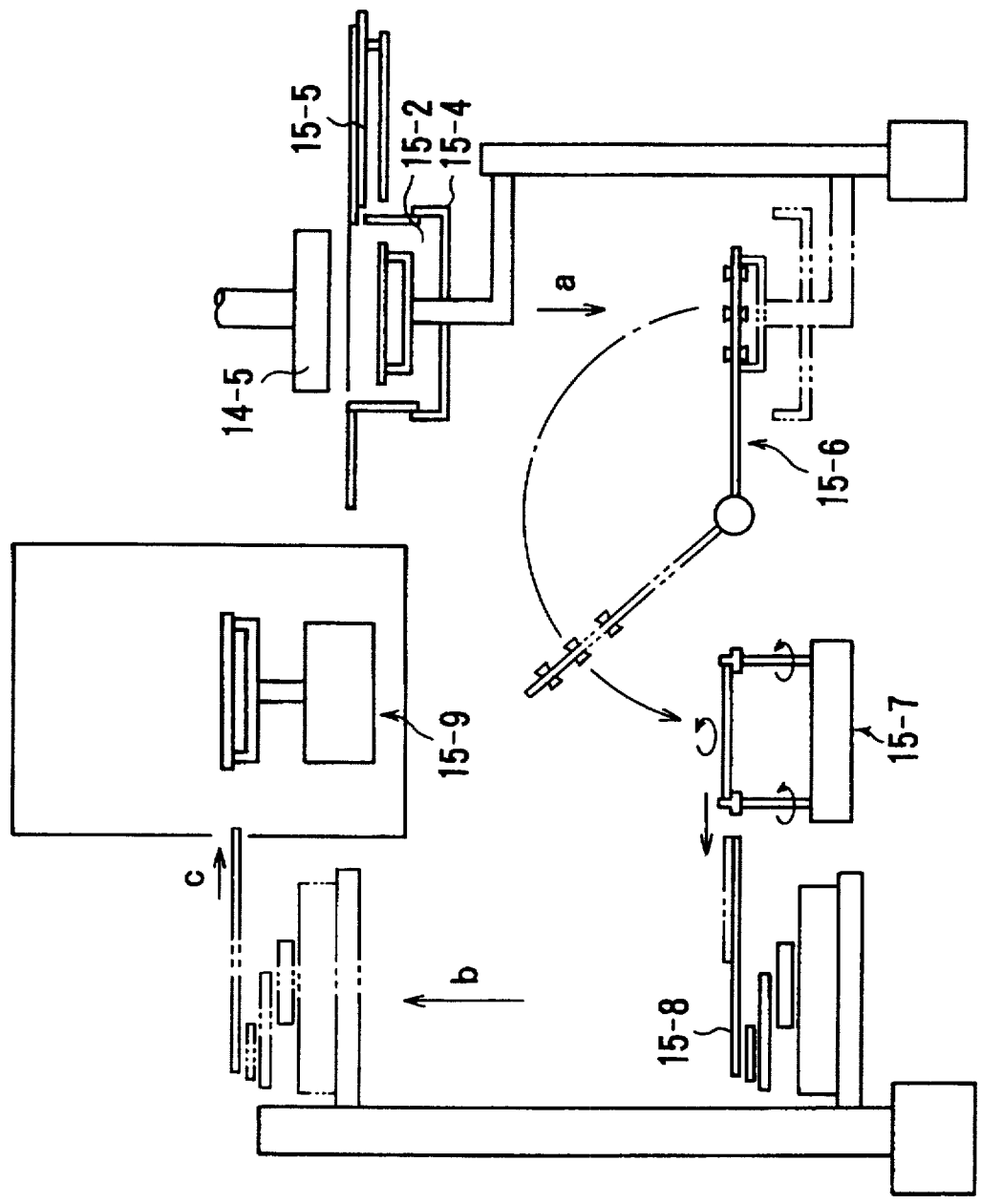
FIG. 5 is a cross-sectional view taken along line D1–C3–C2–C1 of FIG. 2A.

As shown in FIG. 2, the semiconductor wafer S placed on the loading unit 11 is picked up by the arm 10-1 of the center robot 10, is inverted to dispose its surface to be polished downward by an inverting mechanism 11-2 and is transferred to the loading position 14-1 of the polishing unit 14. As shown in FIG. 3, the semiconductor wafer S is held under vacuum by the top ring 14-5 provided at the forward end of the polishing head supporting arm 14-3 and moved above the turntable 14-4. Thereafter, the top ring 14-5 is lowered, and the semiconductor wafer S held by the top ring 14-5 is pressed against the abrasive cloth on the turntable 14-4, whereby the semiconductor wafer S is polished. Incidentally, the turntable 14-4 is rotated by a motor 14-6 through a timing belt 14-7 (see FIG. 4). As shown in FIG. 5, after a polishing process, the semiconductor wafer S is put into a washing receptacle 15-4 which is standing by at the loading position 15-2 of the washing unit 15, and is washed by cleaning solvent. During a washing process, the loading position 15-2 is blockaded by a shutter 15-5. The top ring 14-5 which releases the semiconductor wafer S is washed at the loading position by a washing mechanism of the washing unit 15.

After a washing process, the semiconductor wafer S is moved in the direction (a) and transferred to an inverting mechanism 15-6 by which the semiconductor wafer S is inverted to dispose its surface which has been polished upward and is supplied to a primary washing station 15-7. A primary washing process is carried out using cleaning solvent such as pure water at the primary washing station 15-7. Thereafter, the semiconductor wafer S is picked up by a transfer robot 15-8 in the washing unit 15, moved in the direction of arrows b and c and fed to a secondary washing station 15-9. A secondary washing process is carried out using cleaning solvent such as pure water at the secondary washing station 15-9.

Figure 6:
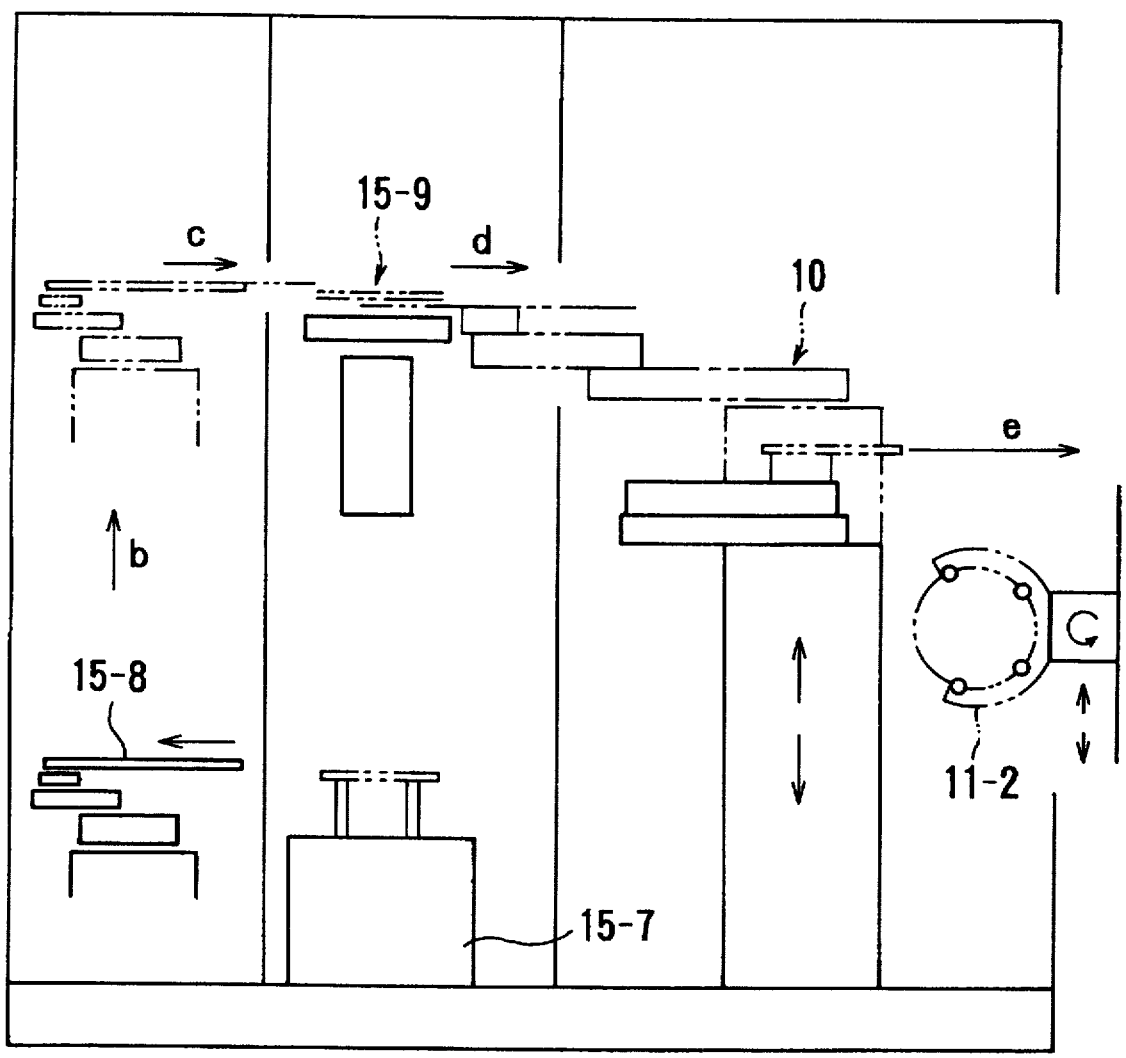
FIG. 6 is a cross-sectional view taken along line D1–D2 of FIG. 2A.

After the secondary washing process, the semiconductor wafer S is picked up by the arm 10-2 of the center robot 10, moved in the direction of arrows d and e as shown in FIG. 6, and transferred to the unloading unit 12. As shown in FIG. 2, there is provided a dressing mechanism 15-11 for dressing the abrasive cloth on the turntable 14-4. The dressing mechanism 15-11 has a rotating brush 15-12 as shown in FIG. 3.

According to the first embodiment, the polishing apparatus comprises a center robot 10 having arms 10-1 and 10-2 and constituting a universal transfer robot for transferring the semiconductor wafer S to the respective units, a plurality of units disposed around the center robot 10 and including a loading unit 11 for receiving thereon the semiconductor wafer S to be polished, an unloading unit 12 for receiving thereon the semiconductor wafer S which has been polished, polishing units 13 and 14 each for polishing the semiconductor wafer S and a washing unit 15 for washing the semiconductor wafer S. The polishing apparatus further comprises a polishing head supporting arm 13-3 having a top ring for transferring the semiconductor wafer S between two adjacent units and a polishing head supporting arm 14-3 having a top ring for transferring the semiconductor wafer S between two adjacent units. The center robot 10 handles a clean and dry semiconductor wafer S, and the polishing head supporting arms 13-3 and 14-3 handle a dirty and wet semiconductor wafer S.

The center robot 10 has the arm 10-1 which is exclusively used for loading the semiconductor wafer to be polished and the arm 10-2 which is exclusively used for unloading the semiconductor wafer which has been polished. This arrangement is preferable in the case where the degree of cleanliness of the semiconductor wafer S transferred from the loading unit 11 is different from that of the semiconductor wafer S transferred to the unloading unit 12.

Figure 7:
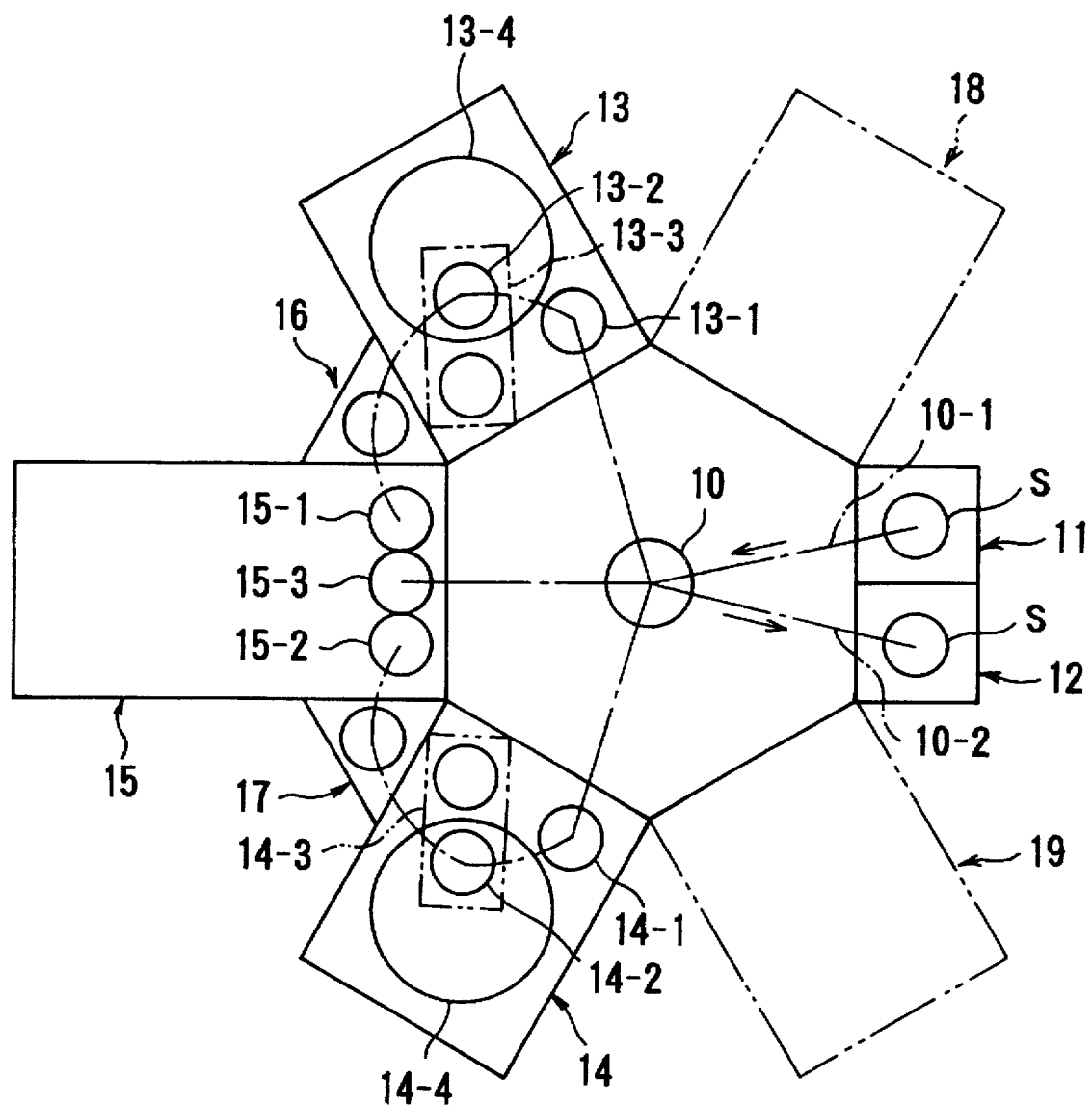
FIG. 7 is a schematic plan view of the second embodiment of a polishing apparatus according to the present invention.

Next, a second embodiment of the polishing apparatus according to the present invention will be described below with reference to FIG. 7. The parts shown in FIG. 7 which are identical to those of FIG. 1 are denoted by identical reference numerals. A polishing apparatus has a center robot 10 having arms 10-1 and 10-2 at a central part thereof. Around the center robot 10 and in the area that can be accessed by the arm 10-1, there are provided a loading unit 11, an unloading unit 12, polishing units 13 and 14, a washing unit 15, and auxiliary spaces 18 and 19 for accommodating additional units, in a hexagonal arrangement.

In the auxiliary spaces 18 and 19, for example, a thickness meter for measuring a thickness of the semiconductor wafer is installed. In this case, the semiconductor wafer S is held by the arm 10-1 of the center robot 10 and fed to the thickness meter in the auxiliary space 18. Before a polishing process, a thickness of the semiconductor wafer S is measured by the thickness meter, and then the wafer 5 is transferred to the loading position 13-1 of the polishing unit 13.

After a polishing process, the semiconductor wafer S is transferred to the washing unit 15 in the same manner as the first embodiment, and washed in the washing unit 15. After a washing process, the semiconductor wafer S is fed to the thickness meter in the auxiliary space 18 by the arm 10-1 of the center robot. After a thickness of the semiconductor wafer S which has been polished is measured, the semiconductor wafer S is transferred to the unloading unit 12 by the arm 10-2 of the center robot 10.

FIG. 8 shows a third embodiment of the polishing apparatus according to the present invention. The parts shown in FIG. 8 which are identical to those of FIG. 1 are denoted by identical reference numerals. Around a center robot 10 having arms 10-1 and 10-2 and in the area that can be accessed by the arm 10-1, there are provided a loading unit 11, an unloading unit 12, two polishing units 13 and 13, a polishing unit 14, a washing unit 15 provided between the polishing units 13 and 13, and a washing unit 15 provided between the polishing unit 14 and the unloading unit 12, in a hexagonal arrangement. This arrangement is preferable in the case where the polishing unit 13 requires twice as much time as the polishing unit 14 to polish a wafer.

In this case, the transfer of the semiconductor wafer S from the polishing units 13 and 13 to the washing unit 15 and the transfer of the semiconductor wafer S from the polishing unit 14 to the washing unit 15 are performed not by the center robot 10 but by another transfer means such as the polishing head supporting arms 13-3 and 14-3. However, the loading of the semiconductor wafer onto the polishing units 13, 13 and 14 and the picking of the semiconductor wafer from the washing units 15 and 15 are performed by the arms 10-1 and 10-2 of the center robot 10. That is, the center robot 10 does not handle the semiconductor wafer polished by the polishing units 13, 13 and 14 so that the arms 10-1 and 10-2 of the center robot 10 are not contaminated by the semiconductor wafer which has been polished and to which abrasive slurry adheres.

Figure 9:
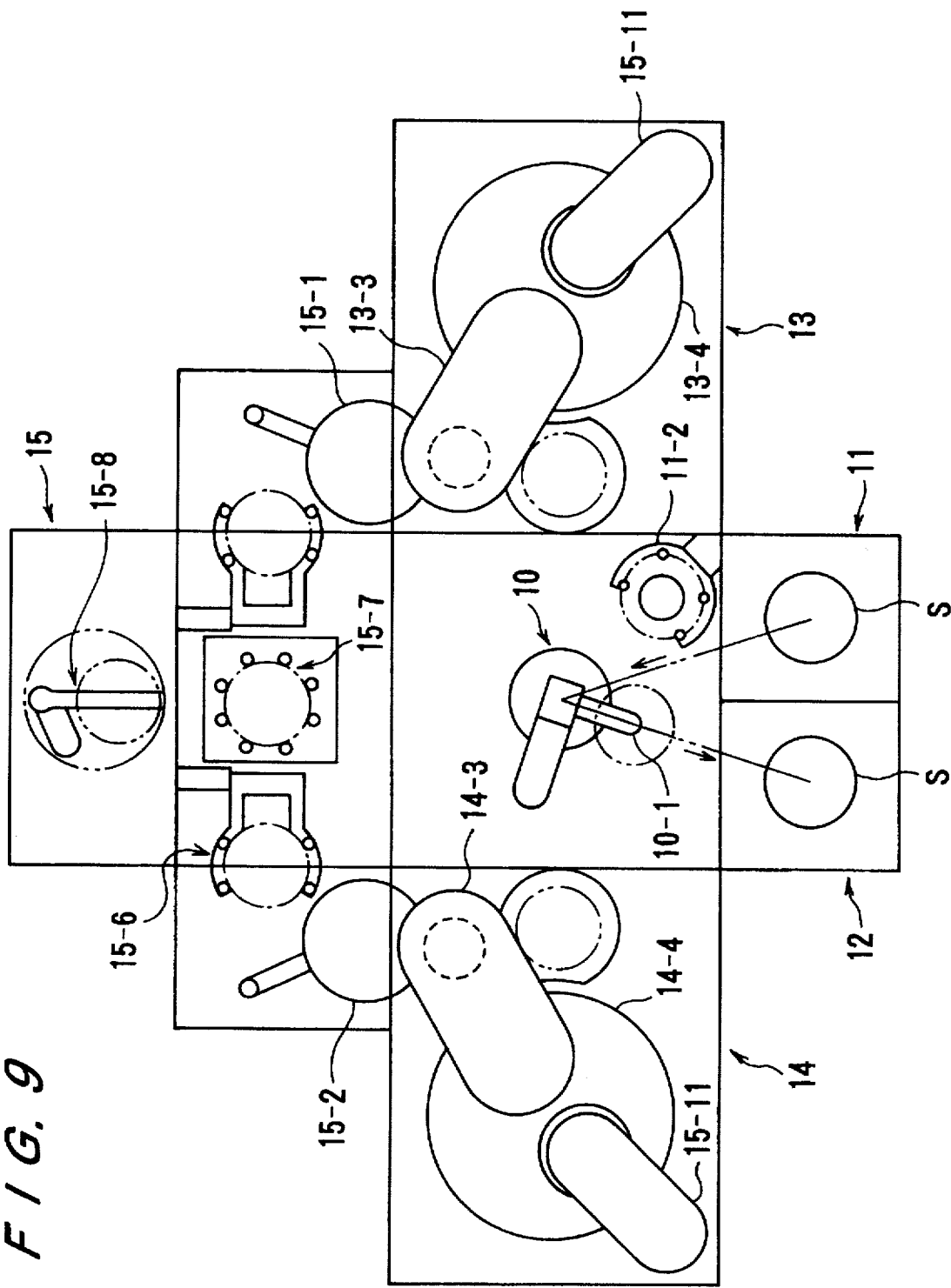
FIG. 9 is a schematic plan view of the fourth embodiment of a polishing apparatus according to the present invention.

FIG. 9 shows a fourth embodiment of the polishing apparatus according to the present invention. The parts shown in FIG. 9 which are identical to those of FIG. 1 are denoted by identical reference numerals. The polishing apparatus is provided with a center robot 10 having only an arm 10-1. In case of providing only the arm 10-1, exclusive transferring devices are provided between the polishing units 13 and 14, and between the polishing units 13, 14 and the washing unit 15. This system is applicable to such a case where cleanliness of the semiconductor wafer which is picked up from the loading unit 11 is substantially the same as that of the semiconductor wafer which is transferred to the unloading unit 12.

Figure 10:
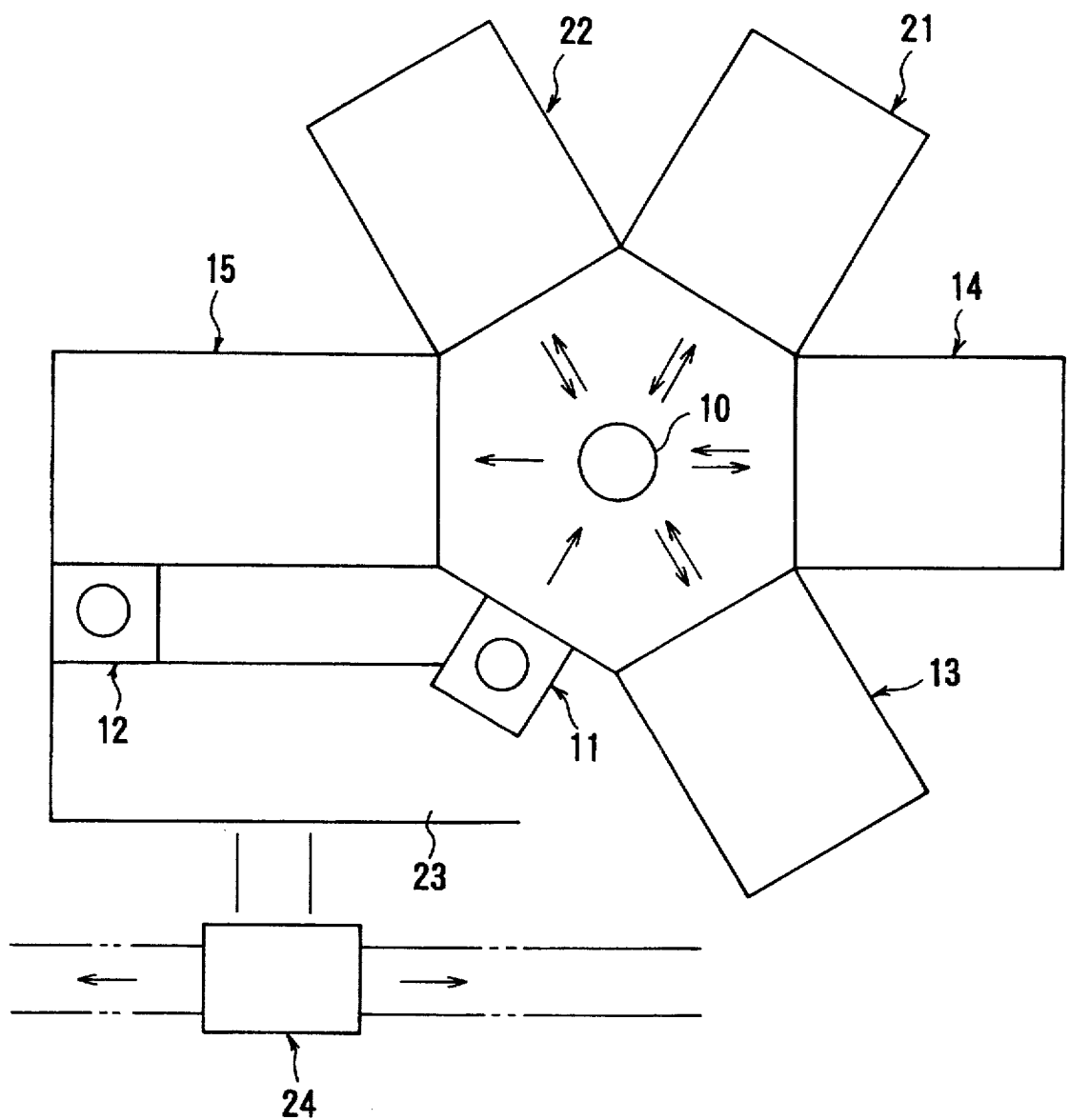
FIG. 10 is a schematic plan view of the fifth embodiment of a polishing apparatus according to the present invention.

FIG. 10 shows a fifth embodiment of the polishing apparatus according to the present invention. The parts shown in FIG. 10 which are identical to those of FIG. 1 are denoted by identical reference numerals. Around a center robot 10 having arms and in the area that can be accessed by the arms, there are provided a loading unit 11, four polishing units 13, 14, 21 and 22, and a washing unit 15, in a hexagonal arrangement. An unloading unit 12 is disposed at the end of the washing unit 15. Further, a storage unit 23 is disposed adjacent to the loading unit 11 and the unloading unit 12. An automatic guided vehicle 24 is used to take the semiconductor wafer S, which has been polished, out of the storage unit 23 and to convey the semiconductor wafer to be polished into the storage 23.

The loading of the semiconductor wafer S onto the polishing units 13, 14, 21 and 22 and the washing unit 15 and the picking of the semiconductor wafer S from the loading unit 11 and the polishing units 13, 14, 21 and 22 are entirely carried out by the center robot 10. Further, the transfer of the semiconductor wafer from the washing unit 15 to the unloading unit 12 is carried out by the center robot 10. The center robot 10 is provided with an arm for exclusively handling a clean semiconductor wafer (hereinafter referred as clean wafer handling arm) and an arm for exclusively handling a dirty semiconductor wafer (hereinafter referred as dirty wafer handling arm). The transfer of the semiconductor wafer from the loading unit 11 to one of the polishing units 13, 14, 21 and 22 and the transfer of the semiconductor wafer from the washing unit 15 to the unloading unit 12 are carried out by the clean wafer handling arm, and the transfer of the semiconductor wafer between the polishing units 13, 14, 21 and 22 and the transfer of the semiconductor wafer from one of the polishing units 13, 14, 21 and 22 to the washing unit 15 are carried out by the dirty wafer handling arm. For example, in the case of using the center robot 10 of FIG. 1, the arm 10-1 serves as the clean wafer handling arm and the arm 10-2 serves as the dirty wafer handling arm. This structure prevents the semiconductor wafer from being contaminated, as much as possible.

According to the fifth embodiment, the polishing apparatus comprises a center robot 10 having arms 10-1 and 10-2 and constituting a universal transfer robot for transferring a semiconductor wafer S to the respective units, a plurality of units disposed around the center robot 10 and including a loading unit 11 for placing thereon the semiconductor wafer S to be polished, an unloading unit 12 for placing thereon the semiconductor wafer S which has been polished, polishing units 13, 14, 21 and 22 each for polishing the semiconductor wafer S and a washing unit 15 for washing the semiconductor wafer S. The center robot 10 is provided with an arm for exclusively handling a clean semiconductor wafer and an arm for exclusively handling a dirty semiconductor wafer. The arm for exclusively handling a dirty semiconductor wafer is washed by a washing mechanism provided in the washing unit 15 after handling the dirty semiconductor wafer.

Figure 11:
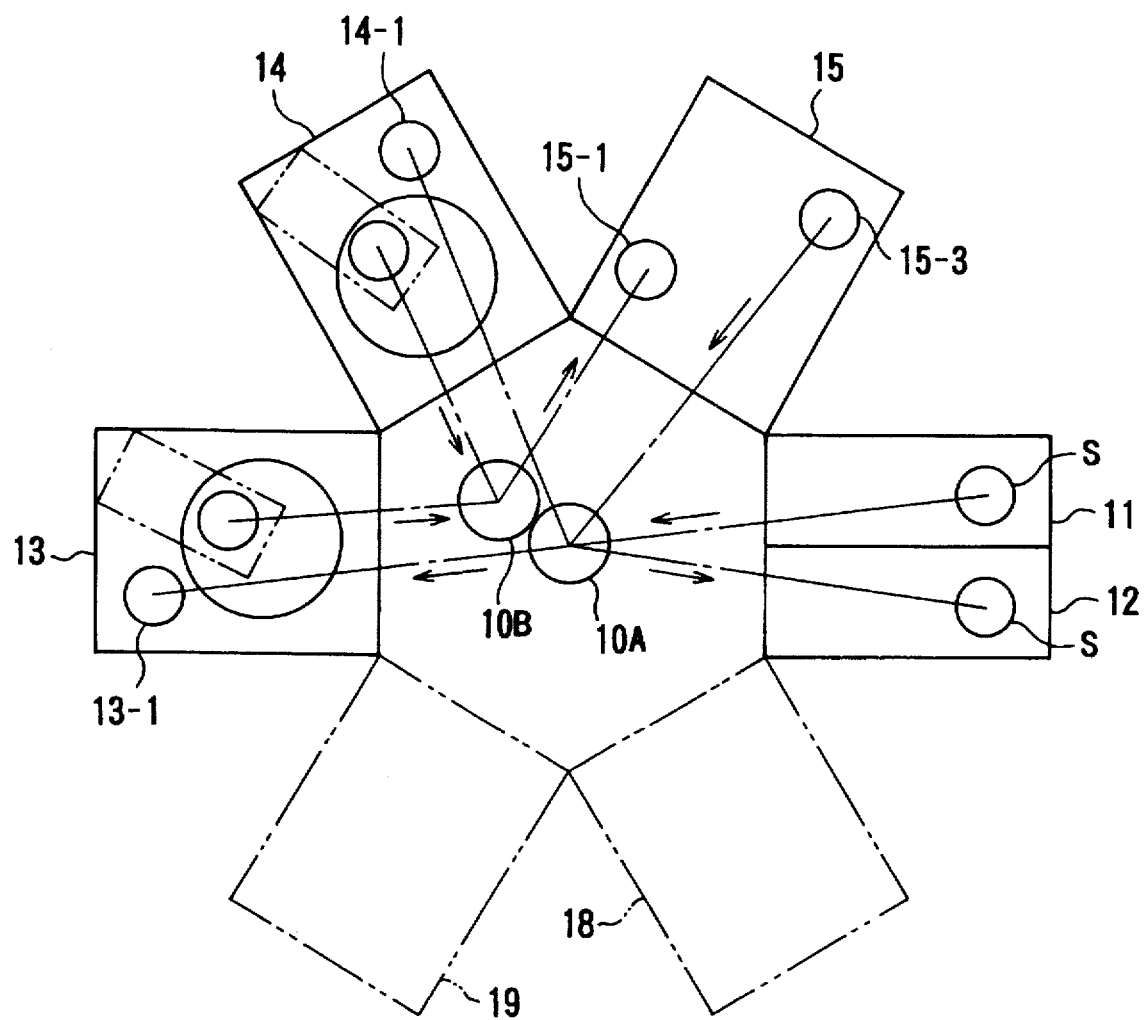
FIG. 11 is a schematic plan view of the sixth embodiment of a polishing apparatus according to the present invention.

FIG. 11 shows a sixth embodiment of the polishing apparatus according to the present invention. The parts shown in FIG. 11 which are identical to those of FIG. 1 are denoted by identical reference numerals. In this embodiment, the polishing apparatus comprises a center robot 10A for exclusively handling a clean semiconductor wafer and a center robot 10B for exclusively handling a dirty semiconductor wafer. Further, the polishing apparatus comprises two polishing units 13, 14 and a washing unit 15.

With the above structure, a semiconductor wafer S is picked up from a loading unit 11 by the center robot 10A, and transferred to a loading position 13-1 of the polishing unit 13. After a polishing process, the semiconductor wafer S is picked up from the polishing unit 13 by the center robot 10B and transferred to a loading position 15-1 of the washing unit 15. After a washing process, the semiconductor wafer S is picked up from a loading position 15-3 of the washing unit 15 by the center robot 10A and transferred to an unloading unit 12. In the above manner, a polishing process and a washing 15 process are carried out. A polishing process is carried out by the polishing unit 14 out in the same manner as described above.

According to this embodiment, the semiconductor wafers S are polished simultaneously or with a certain timelag by the polishing units 13 and 14, and each of the semiconductor wafers S polished by the polishing units 13 and 14 is washed by the washing unit 15. That is, it is possible to deal with two semiconductor wafers by one washing unit for every two polishing units. Especially in the case where the cycle of the washing unit, i.e. the time interval between the washing of a preceding semiconductor wafer to the washing of a subsequent semiconductor wafer, is sufficiently shorter than the time required to polish semiconductor wafers, there is no downtime in the polishing process due to the duration of the washing process. Thus, the processing speed can be high and the total system to can be compact.

Further, the polishing units 13 and 14 can be set to polish semiconductor wafers under different conditions, and selected in accordance with properties of the semiconductor wafers. Furthermore, the semiconductor wafer can be polished by the polishing unit 13, washed by the washing unit 15, and then polished by the polishing unit 14. Thereafter, the semiconductor wafer S can be washed by the washing unit 15. That is, the semiconductor wafer can be polished twice. Incidentally, the polishing apparatus has auxiliary spaces 18 and 19 as shown in FIG. 11.

According to the sixth embodiment, the polishing apparatus comprises two center robots 10A, 10B each constituting a universal transfer robot for transferring a semiconductor wafer S to the respective units, a plurality of units disposed around the center robots 10A and 10B and including a loading unit 11 for receiving thereon the semiconductor wafer S to be polished, an unloading unit 12 for receiving thereon the semiconductor wafer S which has been polished, polishing units 13 and 14 each for polishing a semiconductor wafer S and a washing unit 15 for washing the semiconductor wafer S which has been polished. The center robot 10A handles only a clean semiconductor wafer, and the center robot 10B handles only a dirty semiconductor wafer. The center robot 10B is washed by a washing mechanism provided in the washing unit 15 after handling the dirty semiconductor wafer.

According to the first through sixth embodiments of the polishing apparatus, because at least one polishing unit for performing chemical mechanical polishing and at least one washing unit are disposed around a center robot, the whole system is compact. Therefore, the polishing apparatus can be installed in a clean room without denigrating the cleanliness of the clean room by providing a housing to cover the whole system and an exhaust duct. Further, space in the clean room normally required for installing the polishing apparatus can be saved.

In the above embodiments, although the loading unit 11 and the unloading unit 12 are separately provided, the loading unit 11 and the unloading unit 12 may be integrally provided. For example, in the case where a semiconductor wafer is picked up from a basket containing semiconductor wafers and is put into the same basket after undergoing a polishing process and a washing process, the loading unit and the unloading unit are integrally formed.

According to the present invention, a cluster type of polishing apparatus which integrates a plurality of units including a polishing unit and a washing unit and uses a universal transfer robot can be constructed. Thus, in the polishing apparatus which performs a series of processes including a polishing process and a washing process, installation space can be saved and processing speed can be improved. Further, a plurality of units including at least one polishing unit and at least one washing unit can be efficiently combined. To be more specific, in the case where polishing time is longer than the cycle time of the washing process, a plurality of semiconductor wafers can be dealt with by one washing unit associated with a plurality of polishing units. On the contrary, in the case where the cycle time of the washing process is longer than the polishing time, a plurality of semiconductor wafers can be dealt with by one polishing unit associated with a plurality of washing units. Further, according to the present invention, one or more polishing processes and one or more washing processes can be fully automated and the parameters of these processes can be changed easily.

Furthermore, according to the present invention, since exclusive means for handling a clean semiconductor wafer and exclusive means for handling a dirty semiconductor wafer are separately provided, the contamination of subsequent semiconductor wafers or of respective units of the polishing apparatus caused by the dirty semiconductor wafer can be prevented.

What is claimed is:

1. A unitary, composite apparatus for polishing and then washing a workpiece, said apparatus comprising:

a center robot;

a plurality of units disposed in a cluster arrangement around said center robot and including a loading unit for receipt of a workpiece to be polished, a polishing unit to polish the workpiece and form a polished workpiece, a washing unit to wash the polished workpiece and to form a washed and polished workpiece, and an unloading unit for receipt of the washed and polished workpiece;

said center robot including at least one first transfer mechanism for transferring the workpiece to be polished between said loading unit and said polishing unit and for transferring the washed and polished workpiece between said washing unit and said unloading unit; and at least one second transfer mechanism, separate and discrete from said at least one first transfer mechanism, for transferring the polished workpiece between said polishing unit and said washing unit;

whereby handling of clean workpieces, including the workpiece to be polished and the washed and polished workpiece, is conducted by said at least one first transfer mechanism and is maintained separate and discrete from handling of dirty workpieces, including said polished workpiece, that is conducted by said at least one second transfer mechanism.

2. An apparatus as claimed in claim 1, wherein said at least one first transfer mechanism comprises a single robot arm of said center robot operable to transfer both said workpiece to be polished and said washed and polished workpiece.

3. An apparatus as claimed in claim 2, wherein said at least one second transfer mechanism comprises a polishing head supporting arm of said polishing unit.

4. An apparatus as claimed in claim 1, wherein said at least one first transfer mechanism comprises a first robot arm of said center robot operable to transfer said workpiece to be polished, and a second robot arm of said center robot operable to transfer said washed and polished workpiece.

5. An apparatus as claimed in claim 4, wherein said at least one second transfer mechanism comprises a polishing head supporting arm of said polishing unit.

6. An apparatus as claimed in claim 1, wherein said at least one first transfer mechanism comprises a first robot arm of said center robot, and said at least one second transfer mechanism comprises a second robot arm of said center robot.

7. An apparatus as claimed in claim 1, wherein said at least one first transfer mechanism comprises a robot arm of said center robot, and said at least one second transfer mechanism comprises a robot arm of another center robot.

8. An apparatus as claimed in claim 1, further comprising a storage unit disposed adjacent to at least one of said loading unit and said unloading unit for storing workpieces to be polished and washed and polished workpieces.

9. An apparatus as claimed in claim 1, further comprising a washing mechanism for washing said at least one second transfer mechanism.

10. An apparatus as claimed in claim 1, wherein said plurality of units includes a unit having a meter capable of measuring a thickness of the workpiece.

11. An apparatus as claimed in claim 1, wherein said plurality of units includes plural polishing units.

12. An apparatus as claimed in claim 1, wherein said plurality of units includes plural washing units.

13. An apparatus as claimed in claim 1, wherein said loading unit and said unloading unit are integrated.

14. An apparatus as claimed in claim 1, wherein said plurality of units includes at least two polishing units and at least one washing unit.

15. An apparatus as claimed in claim 1, wherein said plurality of units includes at least one polishing unit and at least two washing units.

16. An apparatus as claimed in claim 1, wherein said washing unit includes plural washing stations to perform plural washing operations on the polished workpiece.

* * * * *

UNITED STATES PATENT AND TRADEMARK OFFICE
CERTIFICATE OF CORRECTION

PATENT NO. : 5,616,063
DATED : April 1, 1997
INVENTOR(S) : Katsuya OKUMURA et al.

It is certified that error appears in the above-indentified patent and that said Letters Patent is hereby corrected as shown below:

Column 10, line 39, change "am" to --arm--.

Signed and Sealed this

Twelfth Day of August, 1997

Attest:

BRUCE LEHMAN

*Attesting Officer*   *Commissioner of Patents and Trademarks*